United States Patent [19]
Flinchbaugh et al.

[11] Patent Number: 5,468,156

[45] Date of Patent: Nov. 21, 1995

[54] LOCKING SYSTEM FOR INTERCONNECTION OF DAUGHTER BOARD AND MOTHER BOARD ASSEMBLIES

[75] Inventors: Bernadette M. Flinchbaugh, York Haven; Harold R. Paley, Middletown; John E. Knaub, Carlisle; Christopher J. Schmid, Harrisburg; Adrian L. Melnyk, York, all of Pa.

[73] Assignee: The Whitaker Corporation, Wilmington, Del.

[21] Appl. No.: 312,842

[22] Filed: Sep. 27, 1994

[51] Int. Cl.⁶ .................................................... H01R 13/62
[52] U.S. Cl. .......................................... 439/157; 439/155
[58] Field of Search ..................................... 439/152–160, 439/372, 326–328

[56] References Cited

U.S. PATENT DOCUMENTS

| | | | |
|---|---|---|---|
| 3,590,330 | 6/1971 | Teagno et al. | 317/101 |
| 3,643,816 | 1/1972 | Zell | 339/186 M |
| 3,693,134 | 9/1972 | Trevisiol | 339/59 M |
| 4,008,941 | 2/1977 | Smith | 339/91 P |
| 4,070,081 | 1/1978 | Takahashi | 339/91 R |
| 4,178,051 | 12/1979 | Kocher et al. | 339/45 M |
| 4,241,966 | 12/1980 | Gomez | 339/45 M |
| 4,410,222 | 10/1983 | Enomoto et al. | 339/17 F |
| 4,447,101 | 5/1984 | Gugliotti | 339/45 M |
| 4,487,468 | 12/1984 | Fedder et al. | 339/75 MP |
| 4,537,454 | 8/1985 | Douty | 339/59 M |
| 4,579,408 | 4/1986 | Sasaki | 339/45 M |
| 4,648,009 | 3/1987 | Beun et al. | 361/399 |
| 4,715,820 | 12/1987 | Andrews, Jr. et al. | 439/59 |
| 4,756,694 | 7/1988 | Billman et al. | 439/61 |
| 4,761,141 | 8/1988 | Hawk et al. | 439/153 |
| 4,781,612 | 11/1988 | Thrush | 439/328 |
| 4,898,540 | 2/1990 | Saito | 439/326 |
| 5,021,004 | 6/1991 | Heiney | 439/317 |
| 5,057,029 | 10/1991 | Noorily et al. | 439/157 |
| 5,082,459 | 1/1992 | Billman et al. | 439/637 |
| 5,209,675 | 5/1993 | Korsunsky | 439/326 |
| 5,302,133 | 4/1994 | Tondreault | 439/157 |
| 5,364,282 | 11/1994 | Tondreault | 439/157 |
| 5,389,000 | 2/1995 | Di Viesti et al. | 439/157 |

FOREIGN PATENT DOCUMENTS 2082401  3/1982  United Kingdom.

OTHER PUBLICATIONS

AMP Catalog 82076 Apr. 1991; "Two-Piece Printed Circuit Board Connectors (AMPMODU)"; 16 pages.

AMP Catalog 82012 Feb. 1993; "Ribbon Cable Connector System (AMP-LATCH)"; 11 pages.

Primary Examiner—David L. Pirlot
Attorney, Agent, or Firm—Anton P. Ness

[57] ABSTRACT

A system for locking a daughter board (100) in the header (10) of a mother board (14) without involving the daughter board connector (110). A pair of latch members (50) are disposed within latch-receiving cavities (34) of the header at each end and include latching projections that pass through notches (126) along side edges (124) of the daughter board for latching. Pivoting of the latch members (50) occurs by the daughter board (100) pushing on ejector feet (62) to pivot the latch members about cylindrical bosses (66) within cylindrical seats (36) along side walls (40) of cavities (34). Embossments (70) cooperate with detents (38,42) in cavity side walls (40) to retain the latch members in either the open or closed positions. Protruding actuating sections (58) permit latch member pivoting to unlatch from the daughter board, with ejector feet (62) initiating board removal movement.

14 Claims, 6 Drawing Sheets

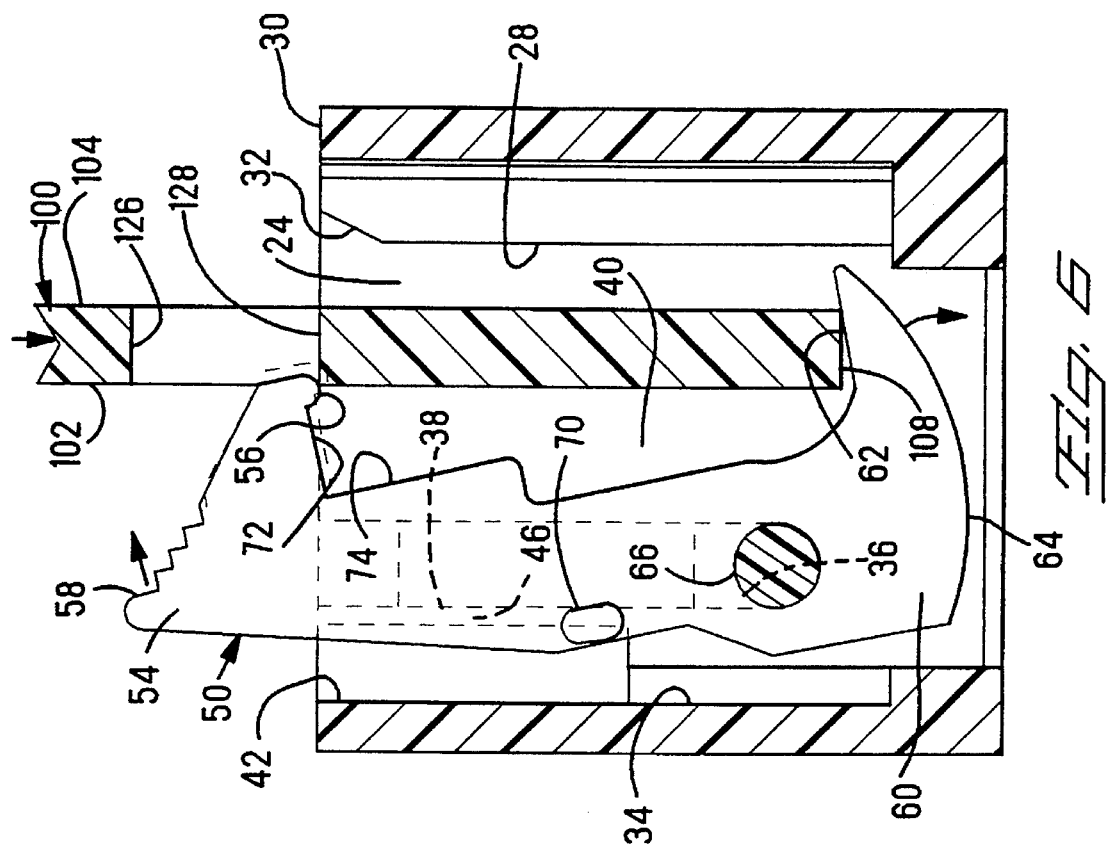
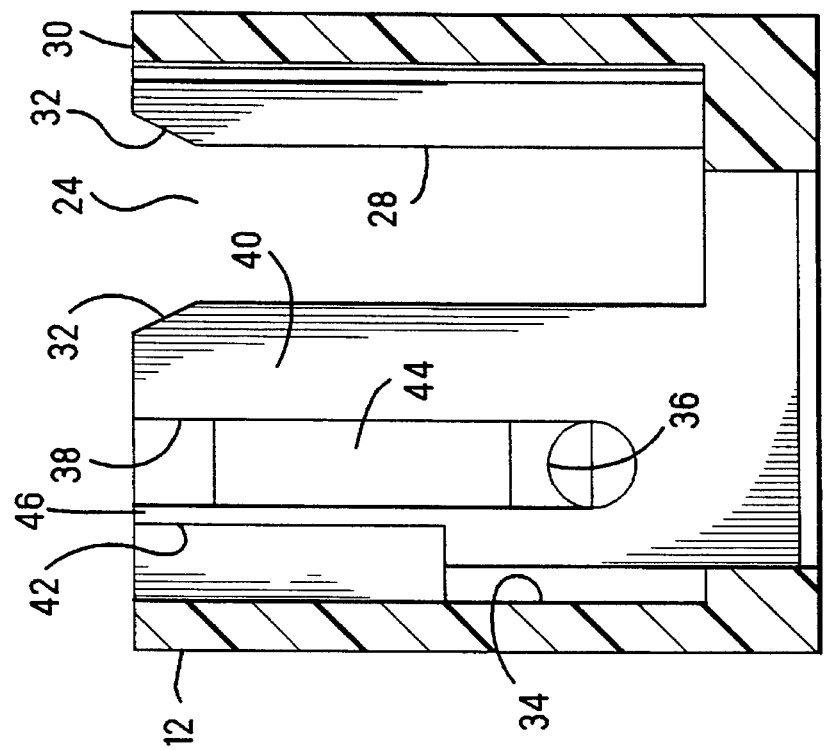

LOCKING SYSTEM FOR INTERCONNECTION OF DAUGHTER BOARD AND MOTHER BOARD ASSEMBLIES

FIELD OF THE INVENTION

This relates to the field of electrical connectors and more particularly to electrical connectors providing interconnection of a mother board to a daughter board at a daughter board edge.

BACKGROUND OF THE INVENTION

One approach to providing electrical connection to circuits of a circuit board is known in which an electrical connector is mounted along an edge portion thereof. The connector includes a plurality of electrical contacts secured in a housing, with respective first contact sections in electrical engagement with exposed contact pads or plating material of through holes along one or both major surfaces of the circuit board proximate the edge surface. The connector includes a mating face for mating to another electrical connector such that second contact sections of the contacts become mated with corresponding contacts of the other connector. The first connector may be a receptacle connector mounted to an edge of a daughter board, while the other connector may be for example a header mounted on a mother board, with the boards to be oriented at right angles in their interconnected condition. One such connective arrangement is disclosed in U.S. Pat. No. 3,634,816. Another arrangement is disclosed in U.S. Pat. No. 4,715,820 in which the electrical interconnection is provided by a blade portion of the receptacle connector having contact portions therealong received into a contact-bounded slot of the header, while a portion of a daughter board edge is disposed alongside an outer surface of the header. One product system is sold wherein the header receives a board edge portion into a slot thereof, the AMPMODU Two-Piece Interconnection System sold by AMP Incorporated, Harrisburg, Pa. as Part Nos. 532975-7 and 532955-7.

Mechanisms are known that lock a card or board to a card edge connector upon insertion of an edge portion of the board into a card-receiving slot of the connector for contacts of the connector to engage circuit traces of the board exposed along the major surface or surfaces at least proximate the edge. One such mechanism is disclosed in U.S. Pat. No. 4,487,468, in which opposed pairs of pivotable arms proximate each end of the edge-receiving slot include facing latch projections associated with holes through the board near its edge, with the pairs of arms moved upon being cammed to rotate toward the board for their latch projections to enter the holes from both sides of the board, and remain in place until cammed outwardly by an actuating mechanism. In U.S. Pat. Nos. 4,756,694 and 4,781,612 related to memory modules, resilient latch arms of an edge-receiving connector housing are integral with the housing near either end of an edge-receiving slot, extending from the slot bottom, with latch projections entering associated board holes for locking from a common side upon full insertion of the board into the slot. The latch projections intrude into the slot from a common side, and the latch arms are deflected by the board edge portion during board insertion, and resile toward the board upon full insertion. Anti-overstress surfaces are provided on the housing adjacent each latch arm to limit the extent of deflection of the latch arms during board insertion.

Discrete latch members are known conventionally with respect to board-mounted headers matable with cable connectors, latchable to end portions of upwardly facing end faces of the cable connectors upon full mating. Such latch members are generally pivotable toward each other for latching, and pivotable away from each other for delatching to unmate the connectors when actuator portions extending beyond the connector end faces and outwardly are manually engaged. Further, it is known to provide ejector feet on the latch members adjacent the bottom of the connector receiving slot that, when the latch members are pivoted outwardly, urge the connector end face upwardly to initiate unmating of the connector from the header and disengage the mated contacts. For example, see U.S. Pat. Nos. 4,241,966; 4,410,222; 4,447,101; 4,579,408; 4,761,141; and 5,021,004.

It is desired to provide a mechanism for positively securing a daughter board in its interconnected relationship with the mother board at right angles, as protection of the interconnection against the effects of vibration and physical shock, where the daughter board is the type having an electrical connector mounted along an edge portion and matable with a header of the mother board for defining electrical interconnections with the mother board, without the securing mechanism utilizing any portion of the receptacle connector.

SUMMARY OF THE INVENTION

The present invention provides a pair of latch members securable to a header mounted on a mother board, with portions latchable directly with cooperating portions of a daughter board, with the daughter board having a receptacle connector mounted along an edge thereof matable with the header for matable pairs of contact members therein to interconnect circuits of the daughter board with corresponding circuits of the mother board. The latch portions are reciprocally movable in a direction perpendicular to a major surface of the daughter board. The latch members are adapted to be moved by the edge of the daughter board, to latch upon receipt of an edge of the daughter board being fully received into a card-receiving slot of the header, the latch members having self-actuating projections or feet being disposed along the bottom of the slot engaged by the edge surface of the daughter card upon full insertion. The latch members further include actuating portions extending outwardly of the header to be manually engaged and pivoted away from the daughter board for delatching to permit the daughter board to be disengaged and removed from the mother board when desired.

It is an objective of the present invention to provide a board-mounted header having a mating face matable with a connector affixed to an edge of a circuit board, which includes latch arms adapted to engage the circuit board to lock the circuit board and its edge-mounted receptacle connector in mated condition with the board-mounted header, thereby being usable with existing receptacle connectors.

It is also an objective for such latch members to be self-actuating to latch without manual or tool assistance.

It is additionally an objective for such latch arms to include actuating portions adapted to be manually engaged to be pivoted away from the circuit board to unlock the circuit board and permit the edge connector to be unmated from the header, and to include ejection portions to engage the board edge to urge the board away from the mother board a selected distance to initiate removal of the daughter board therefrom upon manual actuation of the latch members.

It is a further objective for such latch members to be contained within structure of the header, which provides for abutment thereagainst to prevent overstress of the latch members.

It is a further objective of the present invention to provide for same-side latching and actuation, along a major surface of the daughter board and thereby use no additional board real estate beyond the side edges of the daughter board as clearance for latch member movement.

It is still further an objective for the latch system to have a low height, being recessed entirely within the header, with only manually engageable actuation sections extending above the header.

An embodiment of the invention will now be described by way of example with reference to the accompanying drawings.

BRIEF DESCRIPTION OF THE DRAWINGS

FIG. 5 is a cross-section view of the latch-receiving cavity of the header of FIGS. 1 to 3; and FIGS. 6 to 8 are a sequence of cross sectional views illustrating the daughter board being inserted into the header's slot and engaging the ejector foot of a latch and initiating the pivoting the latch, the latch projection entering the board hole, and latching to the board, respectively.

DETAILED DESCRIPTION OF THE PREFERRED EMBODIMENT

Figure 1:
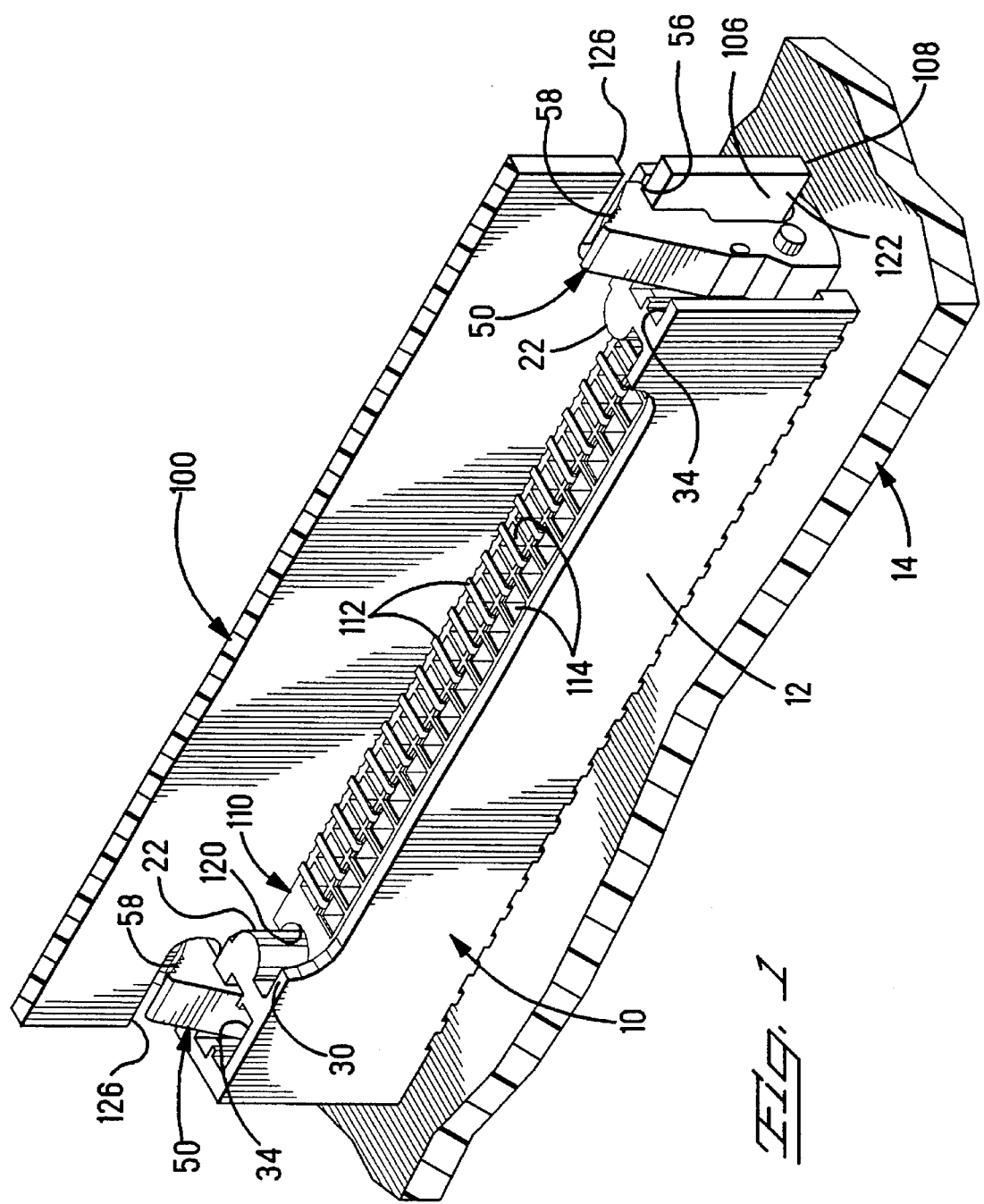
FIG. 1 is an isometric view of a daughter board assembly in mated engagement with a mother board-mounted header, locked in position by the latching arrangement of the present invention.
Figure 2:
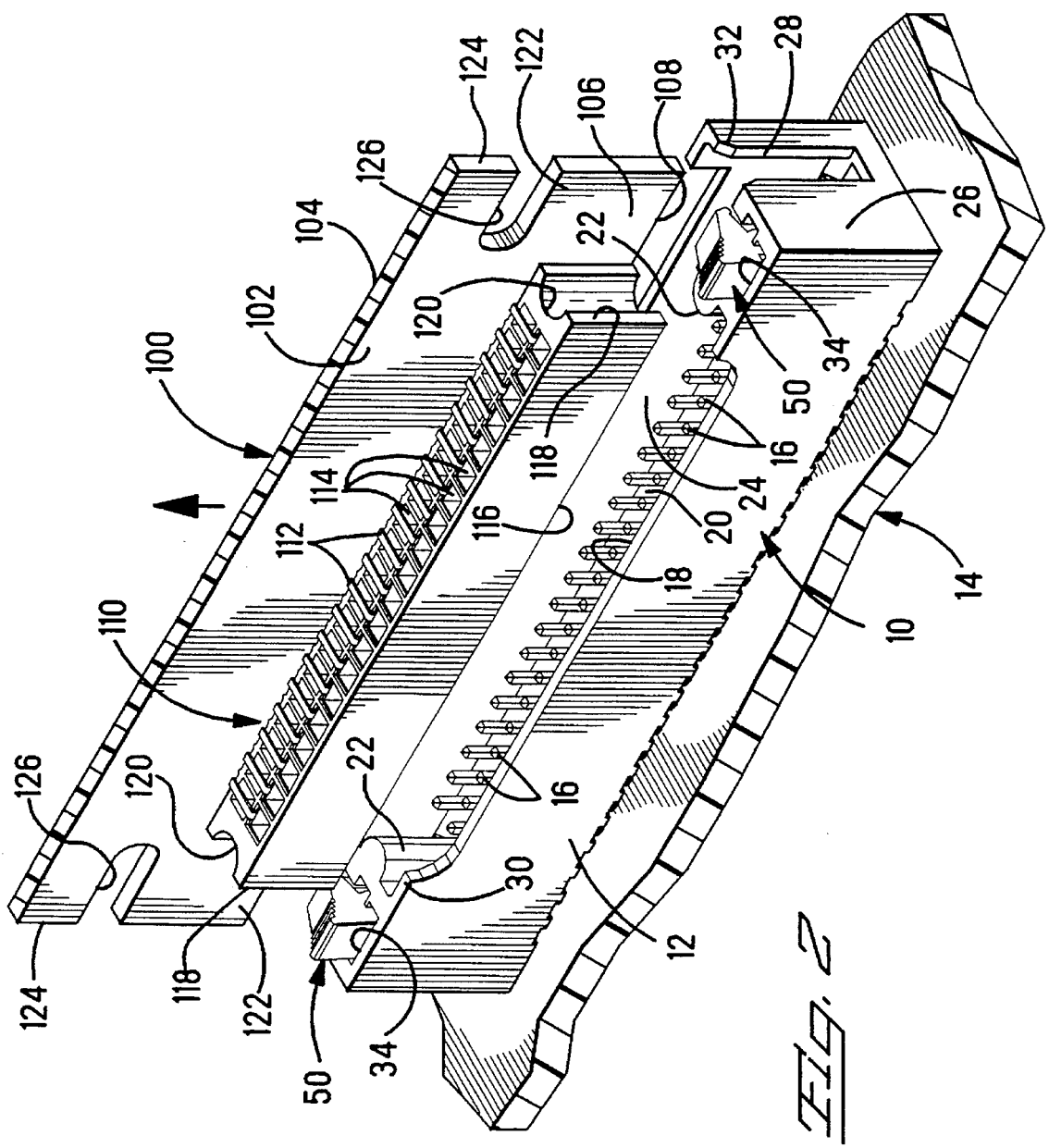
FIG. 2 is an isometric view of the daughter board assembly exploded from the header of FIG. 1.
Figure 3:
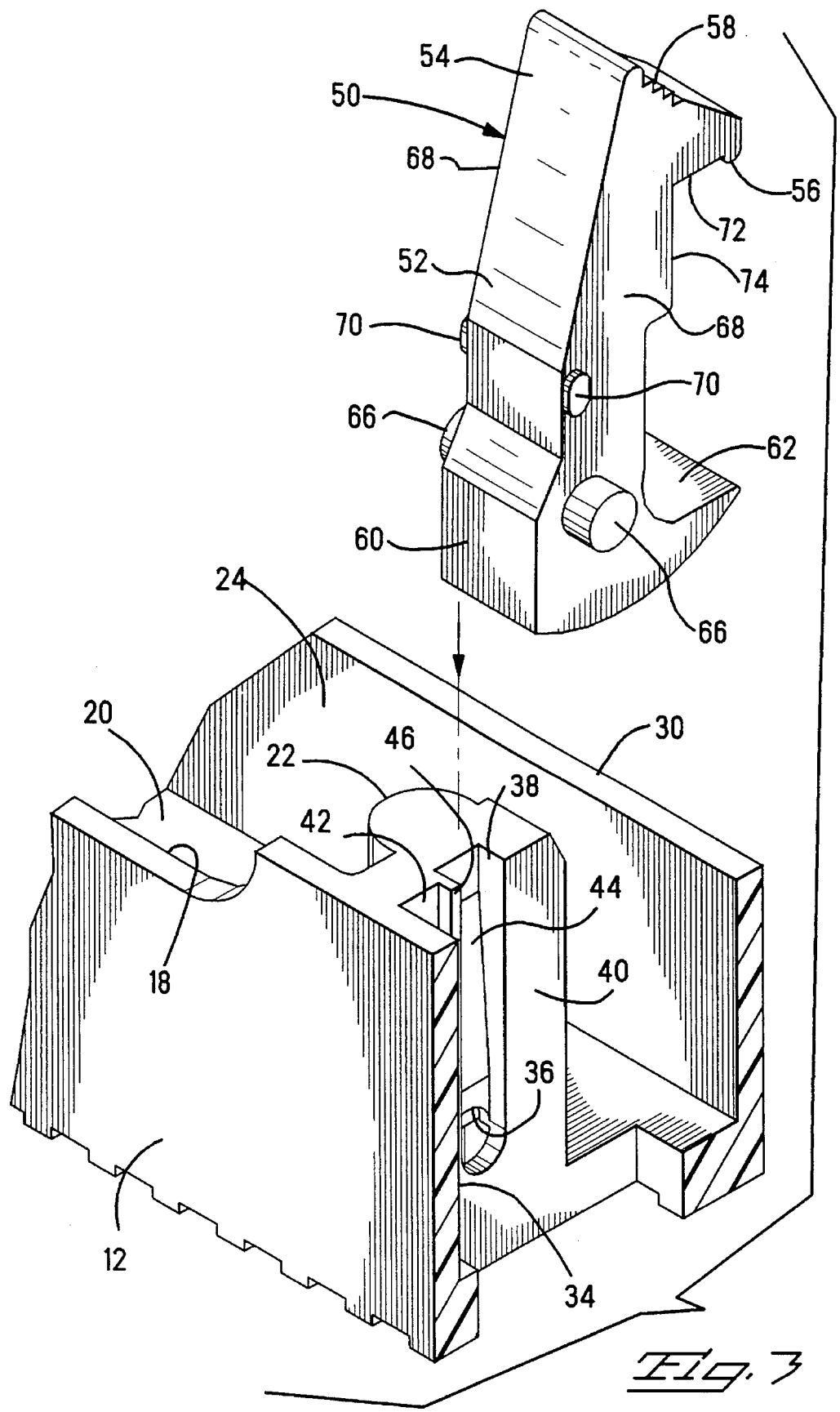
FIGS. 3 and 4 are enlarged partial views of the header of FIGS. 1 and 2, with one of the latch members shown exploded from its cavity, and assembled into the header and locking the daughter board in its fully mated condition, respectively.

Header 10 in FIGS. 1 to 3 includes a housing 12 mounted to mother board 14 and having an array of pin contact members 16 disposed in a large cavity 18 of housing 12 extending upwardly from mating face 20 at the bottom of cavity 18; the contacts are electrically connected to circuits of mother board 14 such as by pin sections extending through plated through holes (not shown) of the mother board, or soldered to surface pads thereof, as is conventional. Header 10 as shown is relatively small and is affixed to the mother board by the terminations of the contacts to through holes of the board, and no additional fastening hardware is needed. An example of a similar existing header is Part No. 532975-7 sold by AMP Incorporated, Harrisburg, Pa.

Daughter board 100 has opposed major surfaces 102,104 and includes an edge portion 106 extending to an edge surface 108. Receptacle connector 110 is affixed to major surface 102 at edge portion 106 and has an array of socket contact members 112 in respective passageways 114 and exposed along mating face 116 to become electrically engaged with pin contact members 16 upon mating, while being electrically engaged with circuits of daughter board 100 (not shown) in a conventional manner, being soldered within plated through holes thereof. As shown, socket contacts 112 in one row spaced from the daughter board major surface 102 are shown to include solder tails extending to the daughter board; the contacts of the other row have their solder tails exiting the mating face to then extend to the daughter board. Side faces 118 of receptacle connector 110 includes alignment grooves 120 cooperable with semicylindrical alignment posts 22 at ends of large cavity 18 of header 10 for alignment of receptacle connector 110 with header 10 prior to engagement and mating of the contacts of the arrays. Receptacle connector 110 as shown is of the type affixed to the daughter board only by soldering of its pin contact sections in plated through-holes of the daughter board, as in Part No. 532955-7 sold by AMP Incorporated, Harrisburg, Pa. that is matable with the header Part No. 532975-7.

Receptacle connector 110 does not extend the entire length of edge portion 106 of daughter board 100, and side portions 122 of daughter board 100 extend beyond side faces 118 of connector 110 to side surfaces 124. Spaced a selected distance from edge surface 108 are opposed notches 126 of a selected length extending inwardly from side surfaces 124.

Header 10 is shown to include a board-receiving slot 24 defined by a vacant region of large cavity 18 adjacent the pin contact array, and end walls 26 of housing 12 include vertical slots 28 extending downwardly from upper edges 30. Upon mating of the daughter board assembly to the mother board assembly, alignment grooves 120 of receptacle connector 110 pass along alignment posts 22 as receptacle connector 110 is received into large cavity 18. Edge portion 106 of daughter board 100 is disposed in board-receiving slot 24, with side portions 122 entering vertical slots 28 of end walls 26 of housing 12 that preferably include chamfered surfaces 32 defining lead-ins at the slot entrances to assist initial entry of the board edge thereinto.

Figure 4:
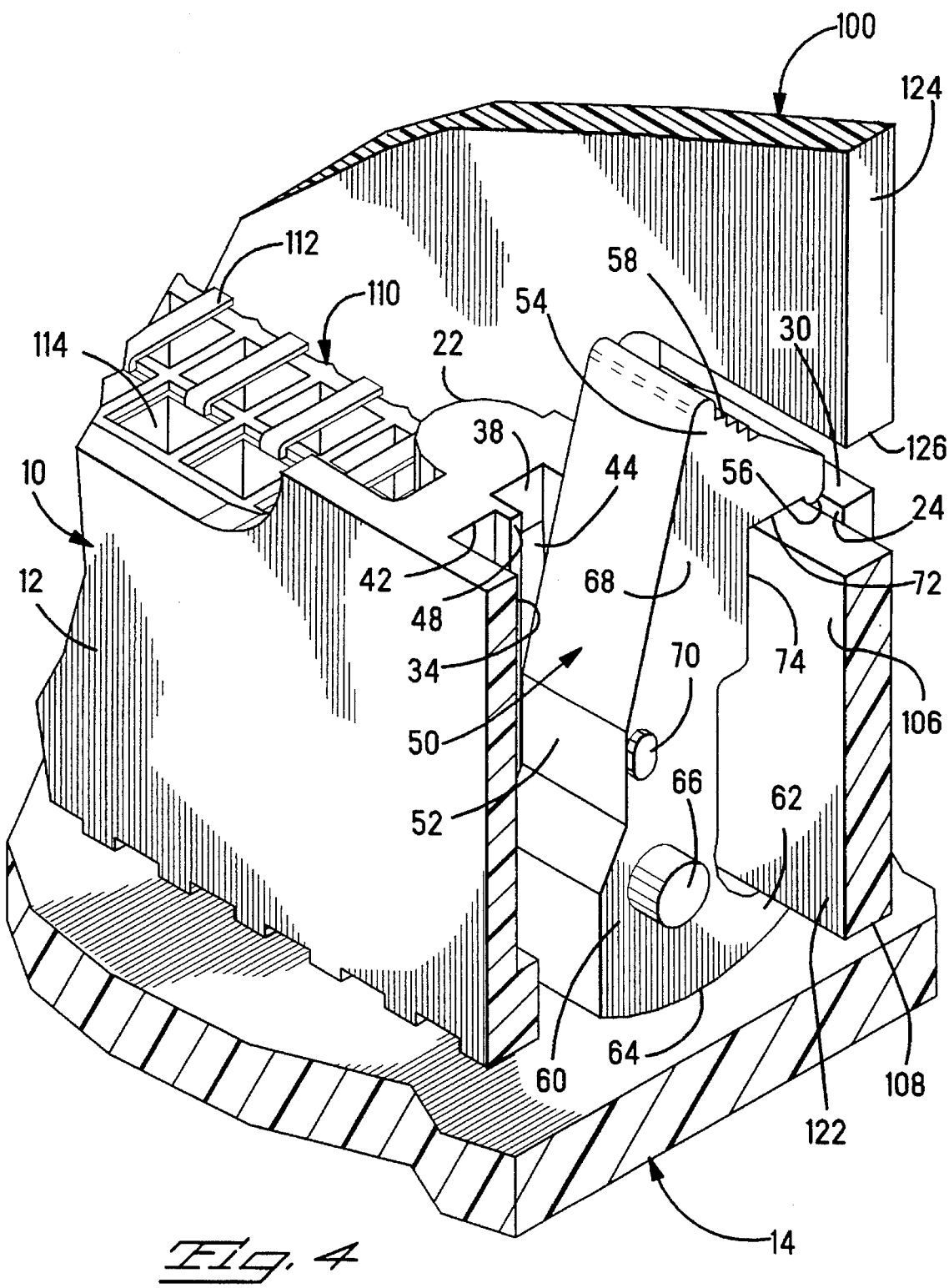

Header housing 12 includes latch-receiving cavities 34 at each end outwardly of the alignment posts into which are assembled latch members 50 that cooperate with notches 126 of daughter card 100 for locking the daughter board assembly in its fully mated position with respect to header 10 and mother board 14. Referring now to FIGS. 3 to 5, each latch member 50 includes a body section 52 extending from upper end 54 including latch projection 56 and manually engageable actuating portion 58, to lower end 60 including ejection foot 62 and shown to define an arcuate lower surface 64. Proximate lower end 60 is defined opposed cylindrical bosses 66 about which latch member 50 pivots during latching and ejection. Cylindrical bosses 66 extend from each side surface 68 and are received in opposed cylindrical seats 36 of housing 12 adjacent cavity 34 at the bottom of respective first vertical channels 38 defined into side walls 40 of cavity 34 and along which bosses 66 pass during insertion of latch member 50 into cavity 34.

During insertion of latch arm 50 into its cavity 34, opposed low height embossments 70 may follow first vertical channels 38 or second vertical channels 42 in side walls 40 of cavity 34 parallel to vertical channels 38. Second vertical channels 42 provide a first detent for embossments 70 when latch member 50 is in its open position. Cylindrical bosses 66 enter the entrance to first vertical channels 38 and bear against tapered wall section 44 in an interference fit, with tapered wall section 44 being angled slightly into latch-receiving cavity 34, until bosses 66 enter cylindrical seats 36 that permit unresisted rotation of bosses 66 therein during pivoting of latch member 50 while defining the retention mechanism of the latch member within the header.

Wall section 46 between first and second vertical channels 38,42 is dimensioned to define a constriction, together with the wall section 46 on the opposite side wall of cavity 34, resisting the passing of low height embossment 70 thereover during pivoting of latch member 50 between its open and closed positions; first vertical channel 38 provides a second detent for embossment 70 when latch member 50 has been pivoted to its closed position. Preferably low height embossments 70 have tapered side surfaces to minimize snagging and resultant wear on wall sections 46, and may be oval. Thus wall sections 46 between first and second vertical channels 38,42 retain the latch member in its open position following removal of a daughter board assembly from its mated condition with the mother board assembly, requiring no attention from a person re-inserting the daughter board assembly.

Latch projection 56 is so positioned to define a recess 72 sufficiently wide enough to receive thereinto a thickness of daughter board 100 while projection 56 is biased against board surface 104 when the opposite major board surface 102 abuts surface portion 74 of latch arm 50. Recess 72 is preferably wide enough to accept daughter boards of varying thicknesses, within a limited range, and thus is especially tolerance-forgiving. Preferably also, latch projection 56 is rounded to prevent stubbing during latching and delatching, and also to minimize wear.

Figure 8:
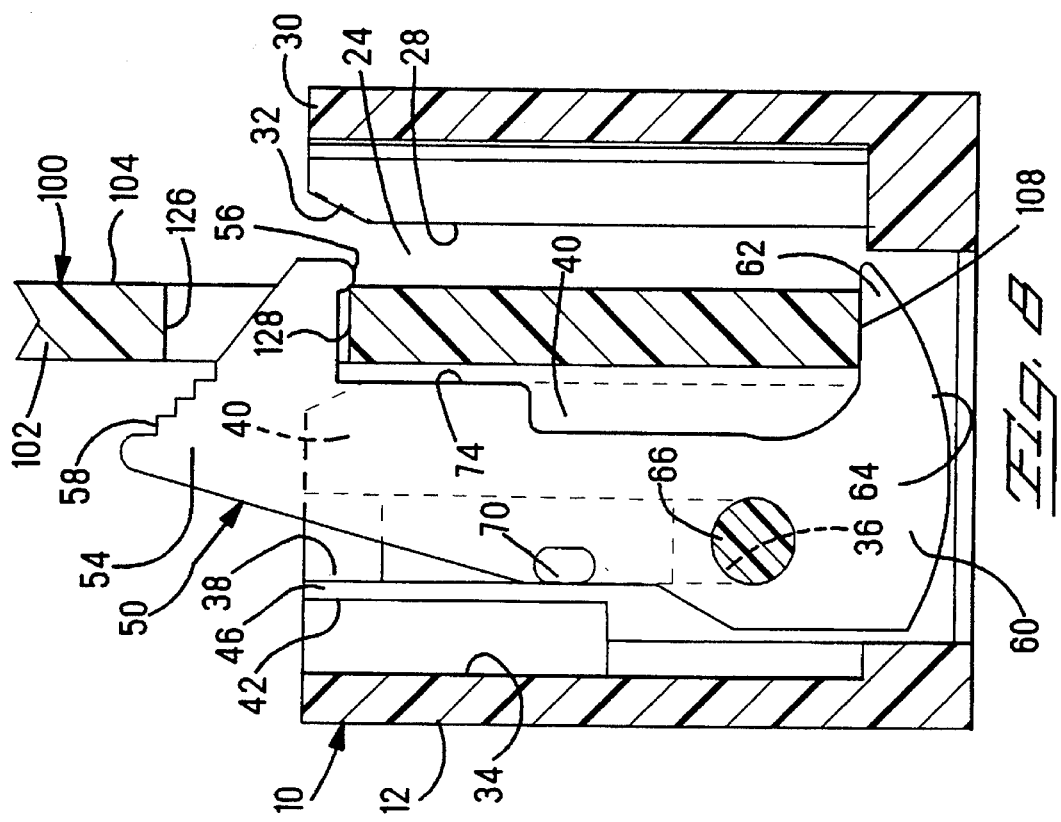
Figure 7:
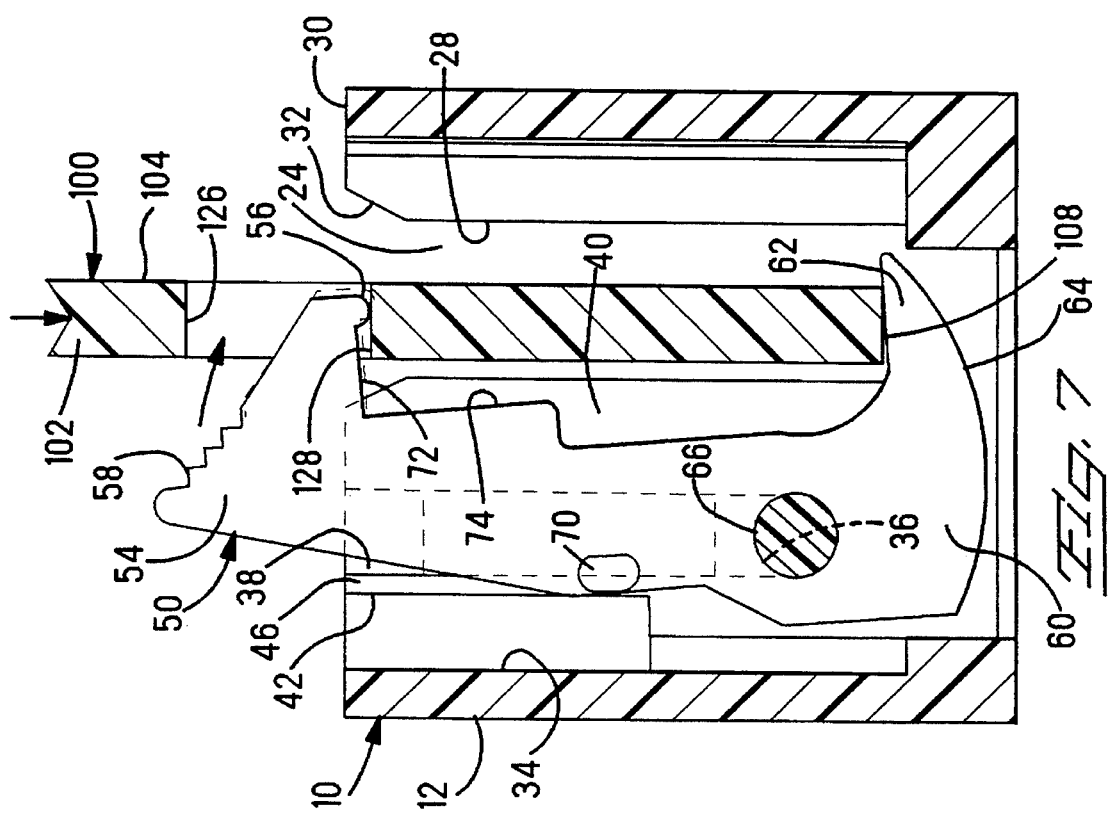

Referring now to FIGS. 6 to 8, the daughter board is shown being mated with the header, and receptacle connector 110 is not seen since it is hidden beyond the wall of latch-receiving recess 34; ends of socket contacts 112 are not shown in these views but would extend within header housing 12 beyond board-receiving region 24. In FIG. 6, daughter board 100 has been almost fully inserted into the board-receiving region 24 of header 10, with the board side portions disposed in slots 28. Edge surface 108 of edge portion 106 engages the top surface of ejector foot 62 of latch member to initiate pivoting of the latch arm in FIG. 6. Low height embossment 70 is seen having been urged out of second vertical channel 42 and beginning to ride over wall section 46.

In FIG. 7, latch arm 50 pivots further and begins to latch to the daughter board. Latching projection 56 has engaged the upwardly facing surface 128 of notch 126 under slight interference fit, with upper end 54 being slightly elastically deformed as daughter board 100 is urged manually downwardly by modest force. Low height embossment 70 continues to be in interference fit with wall section 46 and begins to enter first vertical channel.

Latch member 50 has become fully latched to daughter board 100 in FIG. 8. Latching projection 56 has passed through notch 126 and has latched behind major surface 104 as upper end 54 of latch member 50 has become relaxed, with the thickness of daughter board 100 in recess 72 and opposed from surface 74 of latch member 50. Low height embossment 70 has entered first vertical channel 38 in its second detent position.

Header 10 and latch member 50 may be molded of conventional plastic materials having conventional resilient properties. As shown, the various surfaces of the latch member and the latch-receiving cavity are easily moldable utilizing a conventional and economical dual action mold. Latch-receiving cavity need have no bottom wall, permitting a mold core pin to extend upwardly from the bottom of the mold cavity to define the downwardly facing semicylindrical surface of cylindrical seat 36 (FIGS. 4 and 5).

The tapered wall section 44 of first vertical channel 38 is formed by a mold core pin extending from the top of the mold cavity, which core pin also forms the upwardly facing semicylindrical surface of cylindrical seat 36. Lower surface 64 of latch member 50 is arcuate for all portions of lower end 60 to clear the surface of the mother board during pivoting of the latch member between its open and closed positions. Cylindrical bosses 66 may have a chamfered peripheral edge to facilitate insertion of latch member 50 into latch-receiving cavity 34 as the bosses bear against tapered wall sections 44. Further the absence of a floor to the latch-receiving cavity permits the outer wall to be incrementally elastically deflected outwardly during latch member insertion, due to the interference fit of the pair of cylindrical bosses 70 against their respective tapered wall sections 44 until fully seated in seats 36.

It can be seen that only the actuating section 58 at upper end 54 need extend above the top of header 10, in order to be easily manually engaged when desired, and that generally the latch member is completely recessed within end sections of the header in both open and closed positions. The manner of securing latch members into the header is easily performed and may be done following all soldering operations of the header assembly to the mother board, if desired, with the latch members self-retaining in the header thus eliminating any need for fastening hardware.

The latch members pivot away from the major surface of the daughter board, and thus do not increase the length of the header beyond the side edges of the daughter board. The locking system of the present invention thus does not effectively take more mother board "real estate" than the prior art header and daughter board interconnection. Additionally, the present locking system requires no modification of the existing receptacle connector.

Various modifications and adaptations of the locking system of the present invention can be devised, that are within the spirit of the invention and the scope of the claims.

We claim:

1. A locking system for use in an interconnection of a daughter board assembly of a daughter board and a connector along an edge thereof, and a mother board assembly of a mother board having a connector mounted thereon, the connectors including respective housings containing respective arrays of contacts matable at a mating interface, the locking system comprising:

a pair of latch members pivotally held in respective latch-receiving cavities at opposed ends of said housing of said mother board connector outwardly of said array of contacts thereof, with said latch members being pivotable between closed and open positions;

each said latch member having a latching projection at an upper end protruding into a board-receiving region of said mother board connector from a common side when said latch member is in a closed position, and retracted from said board-receiving region when said latch member is in an open position;

said daughter board includes openings proximate side edges near said edge and outwardly of ends of said connector mounted on said edge and associated with said latching projections;

each said latch member further including a foot at a lower end disposed within said mother board connector to traverse the bottom of said board-receiving region and be engaged by an edge surface of a daughter board inserted into said board-receiving region;

each said latch member including an actuation section exposed to permit engagement for pivoting said latch member from said closed position to said open position; and each said latch member further including a pivot section disposed along a body section between said upper and lower ends cooperable with a corresponding pivot section of said mother board connector to permit pivoting of said latch member upon engagement by and receipt of force from said edge surface of said daughter board during board insertion into said board-receiving region to rotate said latching projection through openings of said daughter boards and to permit pivoting of said latch member upon manual engagement of said actuation section for unlatching said latch member from said daughter boards whereby the locking system is independent of said connector mounted on said daughter board edge.

2. The locking system of claim 1 wherein said openings in said daughter board are notches extending toward each other from said side edges.

3. The locking systems of claim 1 wherein said actuation sections of said latch members extend above said mother board connector housing, and remaining portions thereof are recessed within said latch-receiving cavities in both the open and closed positions.

4. The locking system of claim 1 wherein said board-receiving region extends into said mother board connector in a direction perpendicular to said mother board, and said daughter board is inserted thereinto to be interconnected to said mother board at right angles thereto and locked.

5. The locking system of claim 1 wherein said latch projection of each said latch member includes a rounded free end adapted to bear against a side wall of a respective said daughter board opening with only minimal wear, and latch beyond a far major surface of said daughter board with said side wall of said daughter board opening disposed in a shallow recess between said latching projection and a body section of said latch member.

6. The locking system of claim 5 wherein said latch member defines a distance between said latching projection and said ejector foot selected to be incrementally less than the distance from said daughter board edge surface and said opening side walls whereby said latching projection bears slightly against said side wall during pivoting of said latch member into said closed position assuredly thereafter locking said daughter board to said mother board connector when said latching projection latches beyond said far major surface, and whereby pivoting of said latch member into said closed position is accomplished without assistance by insertion of said daughter board edge fully into said board-receiving region and said latch members are self-actuated.

7. The locking system of claim 1 wherein said pivot section of each said latch member includes a pair of opposed cylindrical bosses disposed in complementary cylindrical seats in opposed side walls of a respective latch-receiving cavity.

8. The locking system of claim 7 wherein said body section of each said latch member further includes a pair of opposed low height embossments spaced from said cylindrical bosses, and said side walls of said latch-receiving cavity includes detents formed therein associated with said low height embossments to cooperate therewith to define open and closed positions of said latch member upon pivoting thereof.

9. The locking system of claim 7 wherein ends of said opposed cylindrical bosses are spaced apart a selected distance, and each said latch-receiving cavity includes opposed first vertical channels in side walls thereof extending to said cylindrical seats from a latch-receiving entrance to said latch-receiving cavity, for receipt of said cylindrical bosses therealong during insertion of said latch member into said latch-receiving cavity.

10. The locking system of claim 9 wherein said first vertical channels together define opposed tapered wall sections spaced apart at a location proximate said latch-receiving entrance a distance just greater than said selected distance between said ends of said opposed cylindrical bosses, and spaced apart proximate said cylindrical seats a distance just less than said selected distance, whereby said cylindrical bosses are elastically compressed toward each other just prior to entering said cylindrical seats and thereafter resile therein to secure said latch member in said mother board connector.

11. The locking system of claim 10 wherein said body section of each said latch member further includes a pair of opposed low height embossments spaced from said cylindrical bosses, and said side walls of said latch-receiving cavity includes detents formed therein associated with said low height embossments to cooperate therewith to define open and closed positions of said latch member upon pivoting thereof.

12. The locking system of claim 11 wherein said first vertical channels define a said detent, and said latch-receiving cavity includes second opposed vertical channels parallel to and spaced from said first vertical channels by narrow wall sections along said side walls and extending from said latch-receiving entrance, to define another said detent.

13. The locking system of claim 12 wherein said low height embossments have angled side edges to minimize stubbing and wear upon bearing against said narrow wall sections between said detents during pivoting of said latch member.

14. The locking system of claim 13 wherein said low height embossments are oval.

* * * * *